(12) United States Patent
Kimoto

(10) Patent No.: US 11,192,509 B2
(45) Date of Patent: Dec. 7, 2021

(54) WIRE HARNESS FOR DISSIPATING HEAT GENERATED BY WIRES

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Yuichi Kimoto, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/980,073

(22) PCT Filed: Mar. 18, 2019

(86) PCT No.: PCT/JP2019/011222
§ 371 (c)(1),
(2) Date: Sep. 11, 2020

(87) PCT Pub. No.: WO2019/188513
PCT Pub. Date: Oct. 3, 2019

(65) Prior Publication Data
US 2021/0009051 A1    Jan. 14, 2021

(30) Foreign Application Priority Data

Mar. 29, 2018 (JP) .............................. JP2018-065998

(51) Int. Cl.
*H01B 7/40* (2006.01)
*B60R 16/02* (2006.01)
(Continued)

(52) U.S. Cl.
CPC ....... *B60R 16/0215* (2013.01); *H01B 7/0045* (2013.01); *H01B 7/40* (2013.01); *H02G 3/0406* (2013.01)

(58) Field of Classification Search
CPC ... B60R 16/0215; B60R 16/02; H01B 7/0045; H01B 7/40; H01B 7/00; H02G 3/0406; H02G 3/04
(Continued)

(56) References Cited

U.S. PATENT DOCUMENTS

| 9,522,640 B2 | 12/2016 | Kanagawa |
| 2005/0011687 A1* | 1/2005 | Yamaguchi ......... B60R 16/0215 180/65.1 |

(Continued)

FOREIGN PATENT DOCUMENTS

| JP | S49-135179 A | 12/1974 |
| JP | 2013-065425 A | 4/2013 |
| JP | 2016-054030 A | 4/2016 |

OTHER PUBLICATIONS

May 28, 2019 International Search Report issued in international patent Application No. PCT/JP2019/011222.

*Primary Examiner* — Timothy J Thompson
*Assistant Examiner* — Michael F McAllister
(74) *Attorney, Agent, or Firm* — Oliff PLC

(57) ABSTRACT

A wire harness including: a plurality of wires each including a core wire and an insulative covering that covers an outer periphery of the core wire; a plurality of protective tubes into which the plurality of wires are respectively inserted, and which are each formed independently; and a fixing member that gathers together and fixes the plurality of protective tubes.

14 Claims, 7 Drawing Sheets

(51) Int. Cl.
 *H01B 7/00* (2006.01)
 *H02G 3/04* (2006.01)

(58) Field of Classification Search
 USPC .......................................................... 174/72 A
 See application file for complete search history.

(56) References Cited

U.S. PATENT DOCUMENTS

2009/0294149 A1* 12/2009 Watanabe .............. H01B 7/426
 174/102 R
2016/0059802 A1 3/2016 Kanagawa
2017/0028945 A1* 2/2017 Kimura ............... B60R 16/0207
2018/0145430 A1* 5/2018 Yanai ........................ H01B 7/02
2018/0175518 A1* 6/2018 Mori ...................... H01R 24/38

* cited by examiner

WIRE HARNESS FOR DISSIPATING HEAT GENERATED BY WIRES

BACKGROUND

The present disclosure relates to a wire harness.

Conventionally, a wire harness to be used in a vehicle such as a hybrid vehicle or an electric automobile includes a wire that electrically connects electrical devices such as a high-voltage battery and an inverter (e.g., see JP 2016-54030A). In this wire harness, multiple wires are covered collectively by a protective tube such as a corrugated tube or a metal pipe for the purpose of protecting the wires and performing electromagnetic shielding.

SUMMARY

Incidentally, in recent years, the amount of current that flows in the wires inserted in the protective tube has tended to increase, and the amount of heat generated by the wires has also increased. For this reason, an improvement in the heat dissipation ability of the wire harness including the protective tube and the wires has been desired.

An exemplary aspect of the disclosure provides a wire harness that can improve the heat dissipation ability.

A wire harness according to an exemplary aspect includes: a plurality of wires each including a core wire and an insulative covering that covers an outer periphery of the core wire; a plurality of protective tubes into which the plurality of wires are respectively inserted, and which are each formed independently; and a fixing member that gathers together and fixes the plurality of protective tubes.

With a wire harness conforming to several aspects of the present disclosure, it is possible to improve the heat dissipation ability.

DETAILED DESCRIPTION OF EMBODIMENTS

Figure 1:
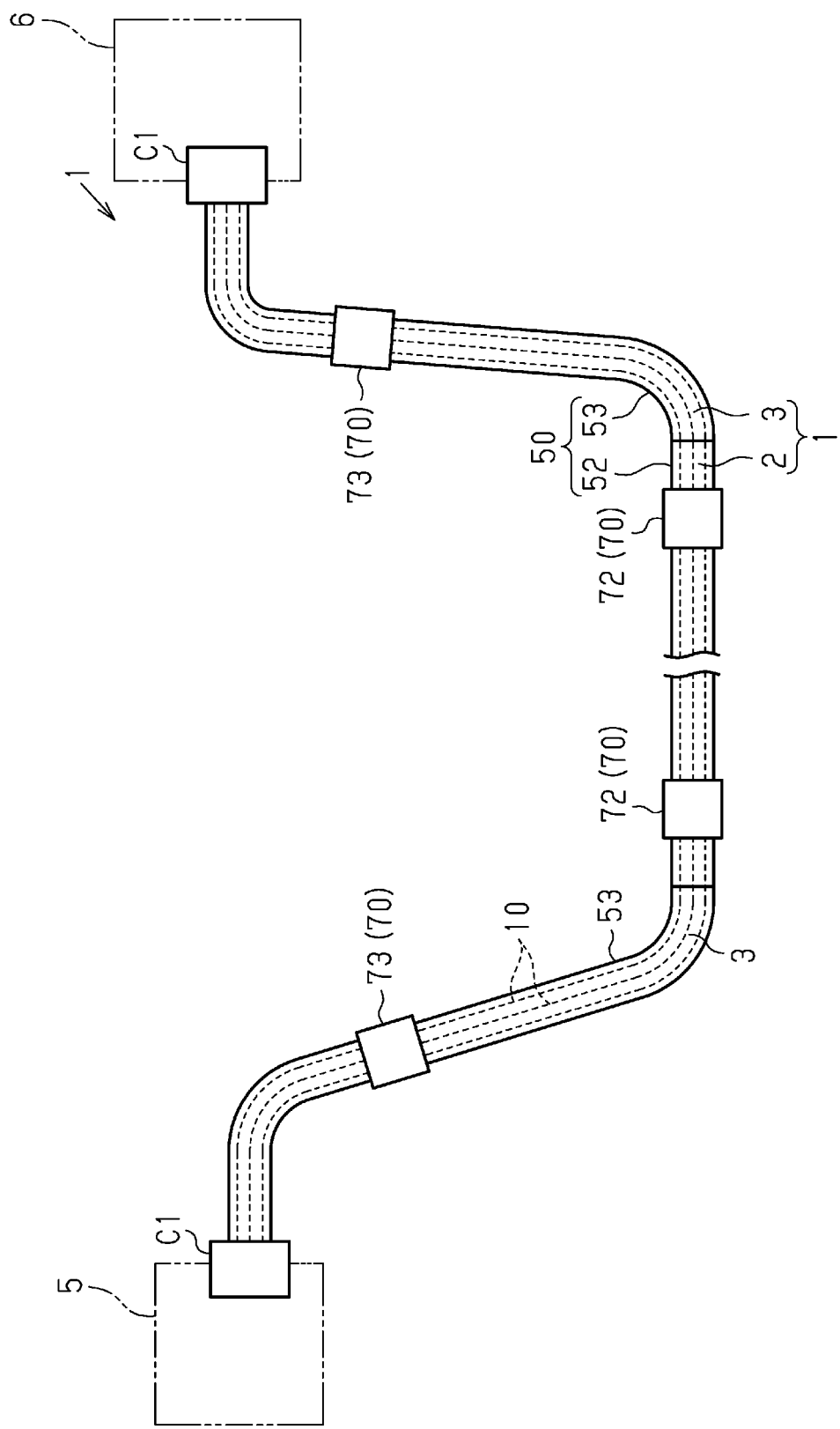
FIG. 1 is a diagram showing a schematic configuration of a wire harness according to an embodiment.

Hereinafter, an embodiment of a wire harness will be described with reference to the drawings. Note that in the drawings, for convenience of description, portions of the configuration are shown exaggerated or simplified in some cases. Also, the dimensional proportions of the portions may differ from the actual dimensional proportions in some cases.

A wire harness 1 shown in FIG. 1 electrically connects two, three, or more electrical devices (devices). For example, the wire harness 1 electrically connects an inverter 5 arranged in a front portion of a vehicle such as a hybrid vehicle or an electric automobile, and a high-voltage battery 6 arranged rearward in the vehicle relative to the inverter 5. For example, the wire harness 1 is wired so as to pass under the floor of the vehicle or the like. The inverter 5 is connected to a wheel-driving motor (not shown) that is a power source for vehicle travel. The inverter 5 generates AC power from DC power of the high-voltage battery 6 and supplies the AC power to the motor. The high-voltage battery 6 is a battery that can supply, for example, a voltage of several hundred volts.

The wire harness 1 has a high-rigidity portion 2 and low-rigidity portions 3 with a lower rigidity than the high-rigidity portion 2. Both end portions of the wire harness 1 preferably have excellent bendability such that the task of connecting to electrical devices such as the inverter 5 and the high-voltage battery 6 is easily performed. On the other hand, a large portion of the wire harness 1 excluding the two end portions is preferably maintained in a predetermined shape so as to prevent sagging and the like. For this reason, in the present embodiment, the low-rigidity portions 3, which have a relatively low rigidity and bend easily, are arranged at both end portions of the wire harness 1, and a high-rigidity portion 2, which has a relatively high rigidity and is not likely to warp, is arranged at the portion other than the two end portions of the wire harness 1. That is, in the present embodiment, an intermediate portion in the extension direction of the wire harness 1 is constituted by the high-rigidity portion 2, and the low-rigidity portions 3 are connected to the two end portions of the high-rigidity portion 2.

The wire harness 1 includes multiple (in FIG. 1, two) conductive paths 10, a pair of connectors C1 that are attached to the two end portions of the conductive paths 10, protective tubes 50 that protect the multiple conductive paths 10, and multiple (in FIG. 1, four) clamps 70. The conductive paths 10 are, for example, high-voltage wires that can handle high voltages and large currents. End portions on one side of the conductive paths 10 are connected to the inverter 5 via one connector C1, and end portions on the other side of the conductive paths 10 are connected to the high-voltage battery 6 via another connector C1.

Figure 2:
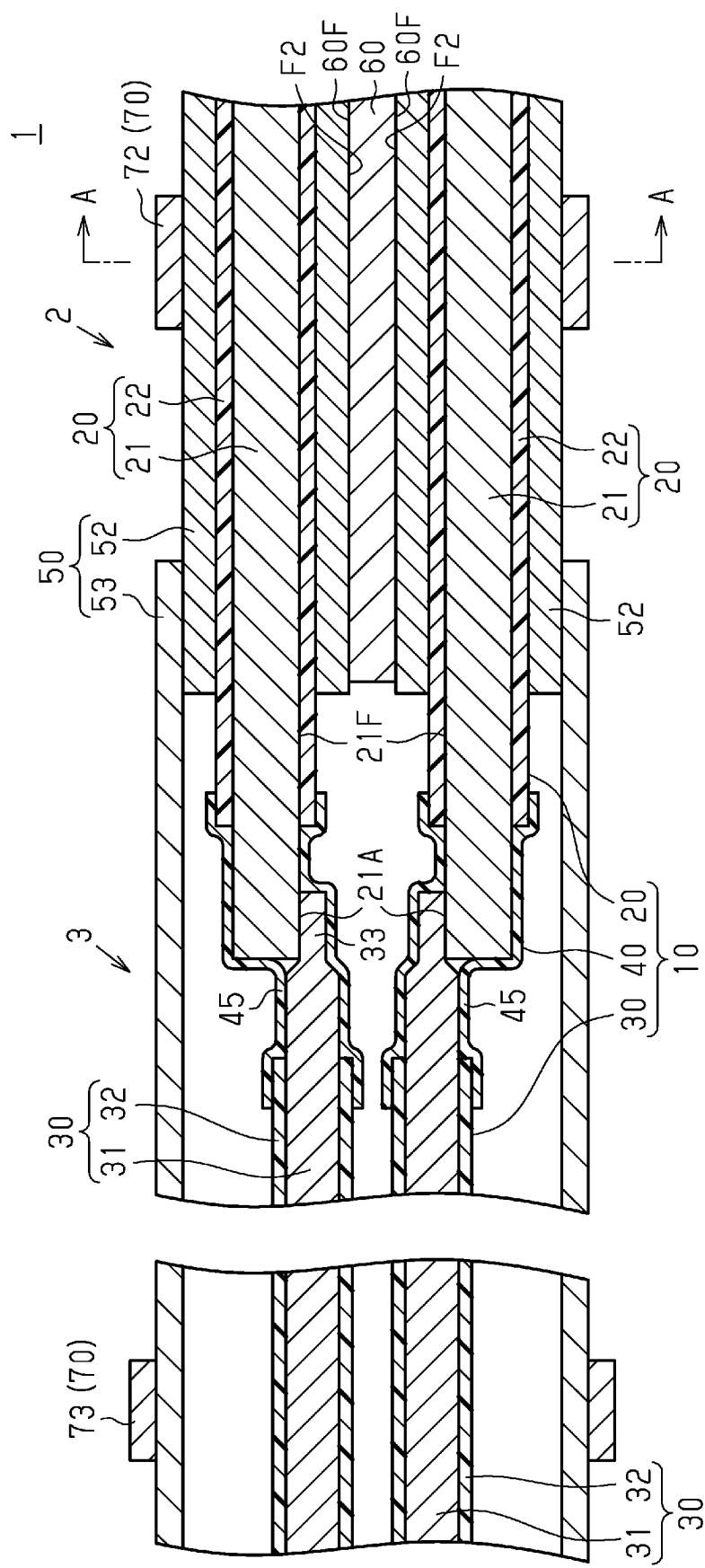
FIG. 2 is a schematic cross-sectional view of a wire harness according to an embodiment.

As shown in FIG. 2, the conductive paths 10 each include a wire 20 wired in the high-rigidity portion 2, wires 30 wired in the low-rigidity portions 3, and connection portions 40 that electrically connect the wire 20 and the wires 30. The conductive paths 10 are each formed by electrically connecting a wire 20 and wires 30, which are of different types, to each other in the extension direction of the conductive path 10. That is, the conductive paths 10 are each formed by electrically connecting a wire 20 and wires 30, which are formed independently, separately from the wire 20, to each other in the extension direction. In the present embodiment, the intermediate portions in the extension direction of the conductive paths 10 are constituted by the wires 20, and the wires 30 are connected to both end portions of the wires 20 (in FIG. 2, only the wires 30 on one end portion side are shown).

For example, the protective tubes 50 protect the conductive paths 10 from flying objects and water droplets. The protective tubes 50 include protective tubes 52 provided on the high-rigidity portion 2 and protective tubes 53 provided on the low-rigidity portions 3. These protective tubes 52 and 53 are fixed to the vehicle body or the like of the vehicle by clamps 70. The clamps 70 include clamps 72 (fixing member) that are provided on the high-rigidity portion 2 and clamps 73 that are provided on the low-rigidity portions 3.

Next, the structure of the high-rigidity portion 2 of the wire harness 1 will be described with reference to FIGS. 2 and 3.

The high-rigidity portion 2 includes the multiple (here, two) wires 20, the multiple (here, two) protective tubes 52, into which the multiple wires 20 are respectively inserted, a heat dissipating member 60 (plate), and the clamps 72. With the above-described high-rigidity portion 2, the multiple protective tubes 52 into which the wires 20 are inserted are gathered together in a predetermined shape via the heat dissipation material 60, and the gathered state (unified state) is maintained by the clamps 72.

The wires 20 each have a rigidity according to which a shape conforming to the wiring path of the conductive path 10 can be maintained, for example. For example, each wire 20 has a rigidity such that a linear shape or a bent state is not released due to vibration or the like of the vehicle when mounted in the vehicle. The wire 20 is easily wired on a wiring path of the conductive paths 10, for example, and is wired at a portion whose shape needs to be held. For example, each wire 20 is wired so as to pass below the floor of the vehicle or the like.

The wires 20 each have a core wire 21 formed by a conductor, and an insulative covering 22 covering the outer periphery of the core wire 21. For example, the wires 20 are non-shield wires that do not have shield structures. The multiple wires 20 are formed such that, for example, their shapes and sizes are the same.

For example, stranded wires formed by braiding together multiple metal strands, single-core wires composed of one columnar metal rod whose inner portion is a solid structure, cylindrical conductors (pipe conductors) whose inner portions are hollow structures, or the like can be used as the core wires 21. The core wires 21 of the present example are constituted by single-core wires. For example, a metal material that is copper-based, aluminum-based, or the like can be used as the material of the core wires 21. The core wires 21 are formed through, for example, extrusion molding.

In the following description, the cross-sectional shape of one elongated element when that elongated element is cut by a plane orthogonal to the axial direction of the elongated element will be referred to as the cross-sectional shape of the outer periphery of the elongated element in some cases. As shown in FIG. 3, the cross-sectional shape of the outer periphery of each core wire 21 is formed into, for example, a non-circular shape. The cross-sectional shape of the outer periphery of each core wire 21 of the present example is formed into a semi-circular shape. The outer peripheral surfaces of the core wires 21 of the present example are each constituted by one flat portion 21F and one curved portion 21R.

The insulative coverings 22 cover the entire outer peripheral surfaces of the core wires 21 in a closely-adhered state, for example. The outer peripheral surfaces of the insulative coverings 22 are formed into shapes corresponding to the outer peripheral surfaces of the core wires 21. The insulative coverings 22 of the present example are formed into semi-circular cylindrical shapes. The outer peripheral surfaces of the insulative coverings 22 of the present example are each constituted by one flat portion 22F and one curved portion 22R. The insulative coverings 22 are constituted by, for example, an insulating material such as a synthetic resin. The insulative coverings 22 can be formed through, for example, extrusion molding (extrusion coating) on the core wires 21. A heat-shrinkable tube or a rubber tube can also be used as the insulative covering 22.

The protective tube 52 has an elongated cylindrical shape. The protective tube 52 of the present example is formed into a semi-circular cylindrical shape. The protective tube 52 has an approximately constant thickness dimension. The multiple protective tubes 52 are formed such that, for example, their shapes and sizes are the same. However, the multiple protective tubes 52 are each formed independently.

The protective tube 52 has a rigidity according to which, for example, a shape conforming to the wiring path of the wire harness 1 can be maintained. For example, the protective tube 52 has a rigidity such that a linear shape or a bent state is not released due to vibration or the like of the vehicle when mounted in the vehicle. For example, a metal pipe or a hard pipe made of resin can be used as the protective tube 52. For example, a metal material that is aluminum-based, copper-based, or the like can be used as the material of the metal pipe. For example, a conductive resin material or a non-conductive resin material can be used as the material of the hard pipe made of resin. The protective tubes 52 of the present embodiment are metal pipes composed of an aluminum-based metal material. This kind of conductive protective tube 52 protects a wire 20 contained therein from flying objects and water droplets, and electromagnetically shields the wire 20 contained therein. That is, the protective tube 52 of the present example functions as a protective tube for protecting the wire 20 and functions also as an electromagnetic shield portion for electromagnetically shielding the wire 20.

One wire 20 is contained in an internal space 52X of each protective tube 52. The internal space 52X of the protective tube 52 is formed into, for example, a shape corresponding to the outline of the wire 20 inserted therein. The internal space 52X of each protective tube 52 of the present example is formed into a semi-circular column shape, similarly to the semi-circular columnar wires 20. The inner peripheral surface of each protective tube 52 is constituted by one flat portion F1 and one curved portion R1. The flat portion F1 is formed so as to oppose the flat portions 21F and 22F of the wires 20 inserted in the protective tube 52, for example. For example, the flat portion F1 is formed into a flat shape so as to conform to the flat portion 22F of the insulative covering 22, and is formed so as to be approximately parallel to the flat portions 21F and 22F of the wires 20. For example, the curved portion R1 is formed so as to oppose the curved portions 21R and 22R of the wires 20 inserted into the protective tubes 52. For example, the curved portion R1 has a circular arc shape so as to conform to the curved portion 22R of the insulative covering 22 and is formed so as to be approximately parallel to the curved portions 21R and 22R of the wires 20 inserted into the protective tubes 52.

The internal space 52X of each protective tube 52 is set to a dimension that is slightly larger than the outline of the wire 20. The difference in dimension between the internal space 52X of the protective tube 52 and the outline of the wire 20 is set with consideration to clearances, dimensional tolerances, and the like that are needed in order to insert the wire 20 into the protective tube 52. In the present embodiment, only a gap of the minimum amount needed to insert the wire 20 is formed between the outer peripheral surface of the wire 20 and the inner peripheral surface of the protective tube 52. For example, the outer peripheral surface of the wire 20 and the inner peripheral surface of the protective tube 52 are in contact with each other on at least a portion of their opposing surfaces. The contact between the outer peripheral surface of the wire 20 and the inner peripheral surface of the protective tube 52 may also be any of surface contact, linear contact, and point contact. In the present embodiment, the inner peripheral surface of the protective tube 52 is in surface contact with approximately the entirety of the outer peripheral surface of the wire 20. Note that the protective tube 52, which is a metal pipe, and the core wire 21 are electrically insulated from each other by the insulative covering 22 of the wire 20.

The cross-sectional shape of the outer periphery of each protective tube 52 of the present example is formed into a semi-circular shape. The outer peripheral surface of each protective tube 52 is constituted by one flat portion F2 and one curved portion R2. The flat portion F2 and the curved portion R2 are formed into, for example, smooth surfaces with few recesses and protrusions.

As shown in FIG. 2, the protective tubes 52 are formed so as to extend in the extension direction of the wires 20. The length of the protective tubes 52 is set to be shorter than that of the wires 20, for example. The protective tubes 52 are provided such that the end portions on both sides of the wires 20 are exposed to the outside.

The heat dissipating member 60 is brought into contact with at least a portion (e.g., the flat portion F2) of the outer peripheral surface of each protective tube 52, and is provided so as to be interposed between the protective tubes 52 that are adjacent to each other. The heat dissipation member 60 is formed so as to extend in the extension direction of the wires 20 and the protective tubes 52. The length of the heat dissipation member 60 is set to be shorter than that of the wires 20, for example. The length of the heat dissipation member 60 of the present example is set to be slightly shorter than that of the protective tubes 52.

The heat dissipation member 60 is formed into a flat plate shape, for example. The cross-sectional shape of the outer periphery of the heat dissipation member 60 of the present example is formed into a rectangular shape. As shown in FIG. 3, the heat dissipation member 60 of the present example includes two flat portions 60F and a pair of side surface portions 60S that are sandwiched between the two flat portions 60F. The flat portions 60F constitute the long sides of the cross-sectional shape of the outer periphery of the heat dissipation member 60 (here, a rectangular shape). The flat portions 60F are formed into, for example, smooth surfaces with few recesses and protrusions. The side surface portions 60S constitute the short sides of the cross-sectional shape of the outer periphery of the heat dissipation member 60 (here, a rectangular shape). A material with a higher thermal conductivity than that of air can be used as the material of the heat dissipation member 60. For example, a material with a higher thermal conductivity than that of the material constituting the protective tubes 52 can also be used as the material of heat dissipation member 60. For example, a metal material such as aluminum or copper, a conductive resin material, or a non-conductive resin material can be used as the material of the heat dissipation member 60. The heat dissipation member 60 of the present embodiment is constituted by a metal material of the same type as the protective tubes 52 (here, an aluminum-based metal material).

Figure 3:
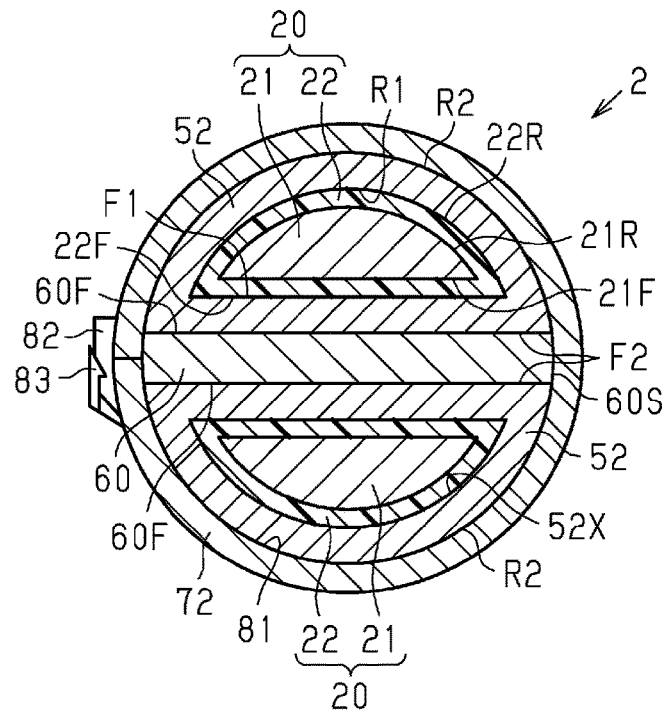
FIG. 3 is a schematic cross-sectional view of a wire harness according to an embodiment (a cross-sectional view taken along line A-A in FIG. 2).

As shown in FIG. 3, the high-rigidity portion 2 of the present embodiment is formed such that the cross-sectional shape (cross-sectional shape of the outer periphery of the high-rigidity portion 2) is approximately circular overall when the two protective tubes 52 into which the wires 20 are respectively inserted and the heat dissipation member 60 are all gathered together (bundled). To state this in more detail, in the high-rigidity portion 2, the two protective tubes 52 that are adjacent to each other are arranged so as to sandwich the heat dissipation member 60 from both sides. Specifically, the heat dissipation member 60 is arranged interposed between the two adjacent protective tubes 52, and the flat portions F2 of the protective tubes 52 and the flat portions 60F of the heat dissipation member 60 are arranged opposing each other and approximately parallel to each other. For example, the flat portion F2 of one of the two protective tubes 52 is in contact with one flat portion 60F of the heat dissipation member 60, and the flat portion F2 of the other protective tube 52 is in contact with the other flat portion 60F of the heat dissipation member 60. For example, the flat portions F2 of the protective tubes 52 are in surface contact with the flat portions 60F of the heat dissipation member 60. In the cross-sectional shape of the outer periphery of the high-rigidity portion 2 of the present embodiment, the length of the flat portions 60F forming the long sides of the rectangular heat dissipation member 60 is set to be approximately the same as the length of the flat portions F2 forming the diameters of the semi-circular protective tubes 52.

The heat dissipation member 60 is provided such that the protective tubes 52 that are adjacent to each other are spaced apart (separated) from each other. That is, the heat dissipation member 60 includes a function of improving the heat dissipation ability of the wire harness 1 and a function of a partitioning member for physically separating the adjacent protective tubes 52 from each other.

The clamp 72 is provided such that the multiple protective tubes 52 and the heat dissipation member 60 are gathered together and fixed to each other. The clamp 72 is attached to the outer peripheral surfaces (also called "side surfaces") of the protective tubes 52 and the heat dissipation member 60 so as to maintain the state in which the multiple protective tubes 52 and the heat dissipation member 60 are gathered together and fixed to each other (unified state). The clamp 72 of the present example gathers together and fixes the multiple protective tubes 52 and the heat dissipation member 60 to each other such that the cross-sectional shape of the outer periphery of the high-rigidity portion 2 is approximately circular overall, and is attached to the outer peripheral surfaces of the protective tubes 52 and the heat dissipation member 60 so as to maintain this state.

The clamp 72 includes a fitting portion 81 that is fit over the multiple protective tubes 52 and the heat dissipation member 60, and a fixing portion (not shown) that is fixed to the vehicle body. For example, a synthetic resin can be used as the material of the clamp 72. For example, an iron-based or aluminum-based metal material can also be used as the material of the clamp 72.

The fitting portion 81 overall has a cylindrical shape (here, a circular cylindrical shape) of a size according to which it can be fit over the protective tubes 52 and the heat dissipation member 60 in the unified state. The fitting portion 81 has a locking portion 82 and a locked portion 83 that can engage with each other. With the clamp 72, the fitting portion 81 can be put in an open state by releasing the engagement of the locking portion 82 and the locked portion 83. Due to the fitting portion 81 being opened, the multiple protective tubes 52 and the heat dissipation member 60 can be fit into the fitting portion 81. Also, with the clamp 72, due to the fitting portion 81 being closed, the multiple protective tubes 52 and the heat dissipation member 60 can be held inside of the fitting portion 81. With the clamp 72, the fitting portion 81 is locked in the closed state due to the locking portion 82 and the locked portion 83 engaging with each other. In this manner, in the state in which the fitting portion 81 is locked, the fitting portion 81 encloses the multiple protective tubes 52 and the heat dissipation member 60, and the fitting portion 81 can apply a predetermined fastening force to that portion. For this reason, when the fitting portion 81 is locked, the unified state of the multiple protective tubes 52 and the heat dissipation member 60 can be maintained. Note that in the state in which the fitting portion 81 is locked, at least a portion of the inner peripheral surface of the fitting portion 81 is in contact with the outer peripheral surfaces of the protective tubes 52 and the outer peripheral surface of the heat dissipation member 60.

Next, the structure of the low-rigidity portions 3 of the wire harness 1 will be described with reference to FIG. 2.

As shown in FIG. 2, the low-rigidity portion 3 includes wires 30 (here, two), a protective tube 53 into which the multiple wires 30 are inserted collectively, and a clamp 73.

The wires 30 are, for example, wires with more excellent flexibility than the wires 20. The wires 30 are, for example, more easily bent than the wires 20. For example, the wires 30 are wired in portions (e.g., both end portions of the conductive path 10) that correspond to the peripheries of the inverter 5 (see FIG. 1) and the high-voltage battery 6 (see FIG. 1), at which the space in the wiring path of the conductive path 10 is narrow and wiring is difficult.

The wires 30 each have a core wire 31 formed by a conductor, and an insulative covering 32 covering the outer circumference of the core wire 31. For example, the wires 30 are non-shield wires that do not have shield structures, for example. The multiple wires 30 are formed such that, for example, their shapes and sizes are the same.

For example, stranded wires, single-core wires, cylindrical conductors, or the like can be used as the core wires 31. The core wires 31 of the present example are constituted by stranded wires. For example, a metal material that is copper-based, aluminum-based, or the like can be used as the material of the core wires 31. A metal of the same type as that of the core wires 21 of the wires 20 or a metal of a different type than that of the core wires 21 may also be used as the material of the core wires 31. The cross-sectional shape of the outer periphery of each core wire 31 is formed into, for example, a circular shape.

The insulative coverings 32 cover the entire outer peripheral surfaces of the core wires 31 in a closely-adhered state, for example. The insulative coverings 32 are constituted by, for example, an insulating material such as a synthetic resin. The insulative coverings 32 can be formed through, for example, extrusion molding (extrusion coating) on the core wires 31. A thermally contracted tube or a rubber tube can also be used as the insulative covering 32.

The protective tube 53 has an elongated cylindrical shape overall. The protective tube 53 is formed into, for example, a circular cylindrical shape. Protective tubes with more excellent flexibility than the protective tubes 52 provided in the high-rigidity portion 2 are preferably used as the protective tubes 53 included in the low-rigidity portions 3. Corrugated tubes that are composed of resin and are flexible, waterproof covers made of rubber, or a combination thereof can be used as the protective tubes 53.

The protective tube 53 is provided so as to enclose the multiple wires 30 collectively. That is, the multiple wires 30 are contained in the interior space of one protective tube 53. The end portions of the protective tubes 53 are fastened to the outer sides of the end portions of the multiple protective tubes 53 and the outer sides of the end portions of the heat dissipation member 60 by bands, tapes (not shown), or the like. For example, the end portions of the protective tubes 53 are air-tightly adhered to the outer sides of the multiple protective tubes 53 and the outer sides of the heat dissipation member 60. The protective tube 53 of the present example is provided so as to collectively enclose the multiple wires 20, multiple connection portions 40, and the multiple wires 30, which are exposed from the protective tubes 52.

Here, the structure of the connection portions 40 will be described.

At a connection portion 40, a core wire 21 of a wire 20 and a core wire 31 of a wire 30 are bonded to each other. For example, the connection portion 40 is provided at a position exposed from a protective tube 52 included in the high-rigidity portion 2. To give a more detailed description, a portions of the end portion of the wire 20 that extends over a predetermined length range from the terminal end of the wire 20 is exposed from the protective tube 52. At the portion of the wire 20 that is exposed from the protective tube 52, the insulative covering 22 is removed over the predetermined length range from the terminal end of the wire 20 and the core wire 21 is exposed. In other words, at the portion of the wire 20 that is exposed from the protective tube 52, the core wire 21 of the portion that extends over the predetermined length range from the terminal end of the protective tube 52 is covered by the insulative covering 22. On the other hand, at the end portion of the wire 30, the insulative covering 32 is removed over the predetermined length range from the terminal end of the wire 30 and the core wire 31 is exposed. Also, in the connection portion 40, the core wire 31 exposed from the insulative covering 32 is bonded to the core wire 21 exposed from the insulative covering 22.

Figure 4:
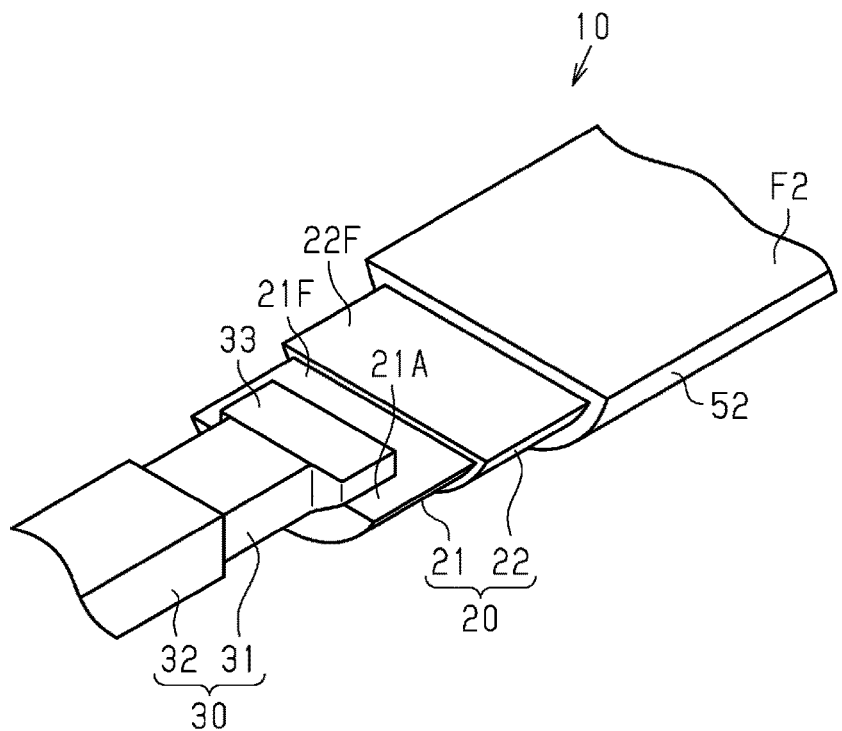
FIG. 4 is a schematic perspective view of a wire harness according to an embodiment.

As shown in FIG. 4, at a connection portion 40 of the present example, the core wire 21 and the core wire 31 are bonded to each other, overlapping in the radial direction (direction intersecting the axial directions of the core wires 21 and 31). To give a more detailed description, the end portion of the wire 21 exposed from the insulative covering 22 has a bonded portion 21A that is bonded to the core wire 31. The bonded portion 21A is constituted by, for example, the flat portion 21F of the outer peripheral surface of the core wire 21. The flat portion 21F forming the bonded portion 21A is formed continuously with no level difference with the flat portion 21F of the core wire 21 at portions other than the bonded portion 21A. That is, the bonded portion 21A (flat portion 21F) of the present example is not formed by being subjected to machining such as crushing.

A block portion 33 is formed at the end portion of the core wire 31 exposed from the insulative covering 32. The block portion 33 is formed by, for example, welding strands of the core wire 31 together to form a block. The block portion 33 is formed into, for example, a flat, roughly cuboid shape. The height (dimension in the up-down direction in FIG. 2) of the block portion 33 is formed so as to be smaller than the diameter of other portions of the core wire 31. The width (dimension in the direction intersecting both the axial direction of the core wire 31 and the height direction of the block portion 33) of the block portion 33 is formed so as to be greater than the diameter of other portions of the core wire 31. As shown in FIG. 2, the block portion 33 of the present example is formed near the center in the radial direction of the core wire 31. For example, the block portion 33 is formed such that its center in the thickness direction and the central axis of the core wire 31 approximately match each other. Due to the block portion 33 being formed at the end portion of the core wire 31, level differences or height gaps are formed on both sides in the height direction of the block portion 33.

As shown in FIGS. 2 and 4, the block portions 33 of the core wires 31 overlap with and are bonded to the bonding portions 21A (flat portions 21F) of the core wires 21. Accordingly, the core wires 21 and the core wires 31 are electrically connected to each other. Note that the method for connecting the core wires 21 and the core wires 31 to each other is not particularly limited. For example, ultrasonic welding, laser welding, or the like can be used as the method for connecting the core wires 21 and the core wires 31 to each other.

As shown in FIG. 2, in the present example, the flat portions 21F of the core wires 21 are arranged so as to face each other via the heat dissipation member 60, and therefore the multiple core wires 31 are arranged so as to oppose each other. In other words, the core wires 21 are not interposed between the two opposing core wires 31. For this reason, the adjacent core wires 31 are arranged at positions near each other.

The connection portion 40 is covered by, for example, an insulating member 45. The insulating member 45 covers the entire peripheries of the core wires 21 and 31 exposed from the insulative coverings 22 and 32. The insulating member 45 is formed so as to span between the insulative covering 22 of the wire 20 and the insulative covering 32 of the wire 30, for example. One end portion of the insulating member 45 covers the outer peripheral surfaces of the terminal end portions of the insulative coverings 22, and the other end portion of the insulating member 45 covers the outer peripheral surfaces of the terminal end portions of the insulative coverings 32. The electrical insulation of the connection portion 40 and the core wires 21 and 31 exposed from the insulative coverings 22 and 32 is ensured by the insulating member 45. For example, a shrinkable tube, a rubber tube, an insulating tape, a hard protector made of synthetic resin, or a combination thereof can be used as the insulating member 45. For example, a heat-shrinkable tube can be used as the shrinkable tube.

For example, the multiple connection portions 40 are preferably arranged side by side in the extension direction of the conduction paths 10. In the example shown in FIG. 6, the multiple connection portions 40 are spaced apart from each other in the radial direction of the conduction paths 10, and are arranged at substantially the same positions in the extension direction of the conduction paths 10 such that they at least partially overlap, or preferably entirely overlap in the extension direction of the conduction paths 10. These multiple connection portions 40 are contained in the internal space of one protective tube 53. Note that an electromagnetic shield member may also be provided inside of the protective tube 53. The electromagnetic shield member may also be provided so as to, for example, collectively enclose the multiple conductive paths 10 (e.g., the end portions of the multiple wires 20, the multiple wires 30, and the multiple connection portions 40) exposed from the multiple protective tubes 52. The electromagnetic shield member is provided, for example, between the inner peripheral surface of the protective tube 53 and the outer peripheral surfaces of the conductive paths 10. For example, a braided wire that is flexible and is formed by braiding multiple metal strands, or a metal foil can be used as the electromagnetic shield member.

The clamp 73 is attached to the outer peripheral surface of the protective tube 53. The protective tube 53 is fixed to the vehicle body of the vehicle by the clamp 73.

Next, an example of a method for manufacturing the wire harness 1 will be described.

Figure 5A:
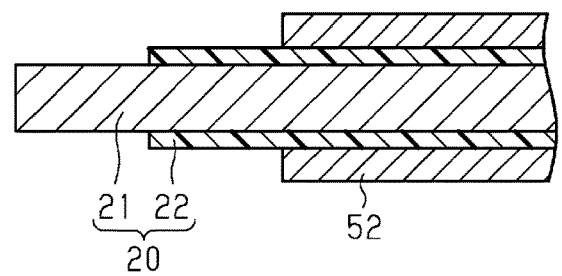
FIGS. 5(a) to 5(c) are schematic cross-sectional views showing a method for manufacturing a wire harness according to an embodiment.

As shown in FIG. 5(a), first, one wire 20 is inserted through each protective tube 52. At this time, both end portions of each wire 20 are exposed from the respective protective tubes 52. Also, a portions of the insulative covering 22 exposed from the protective tube 52, that is, the insulative covering 22 in a predetermined length range from the terminal end of the wire 20, is removed to expose the end portion of the core wire 21.

Figure 5B:
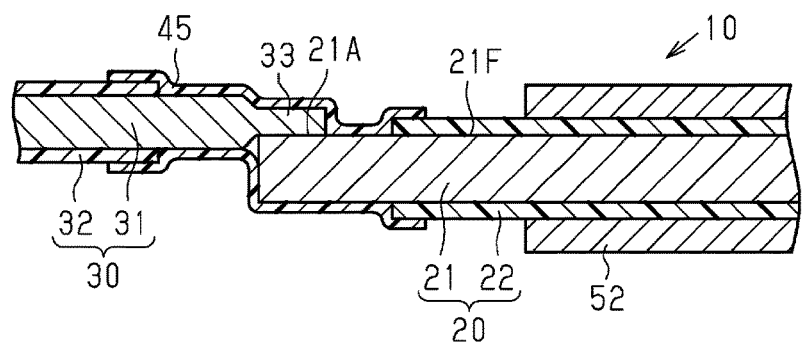

Next, as shown in FIG. 5(b), the insulative covering 32 of the end portion of the wire 30 is removed to expose the end portion of the wire 31. Next, the core wire 31 exposed from the insulative covering 32 is bonded through welding or the like to the core wire 21 exposed from the protective tube 52 and the insulative covering 22. For example, the end portion of the core wire 31 is bonded to the flat portion 21F of the core wire 21. Next, the insulating member 45 is formed so as to cover the core wire 21 exposed from the insulative covering 22 and the core wire 31 exposed from the insulative covering 32. Accordingly, the conductive path 10 in which the wire 20 and the wire 30 are electrically connected to each other in the extension direction is formed. If multiple conductive paths 10 are needed, the multiple conductive paths 10 can be manufactured individually by independently performing the steps shown in FIGS. 5(a) and 5(b). For this reason, the core wires 21 and the core wires 31 can be bonded without being influenced by another conductive path 10.

Figure 5C:
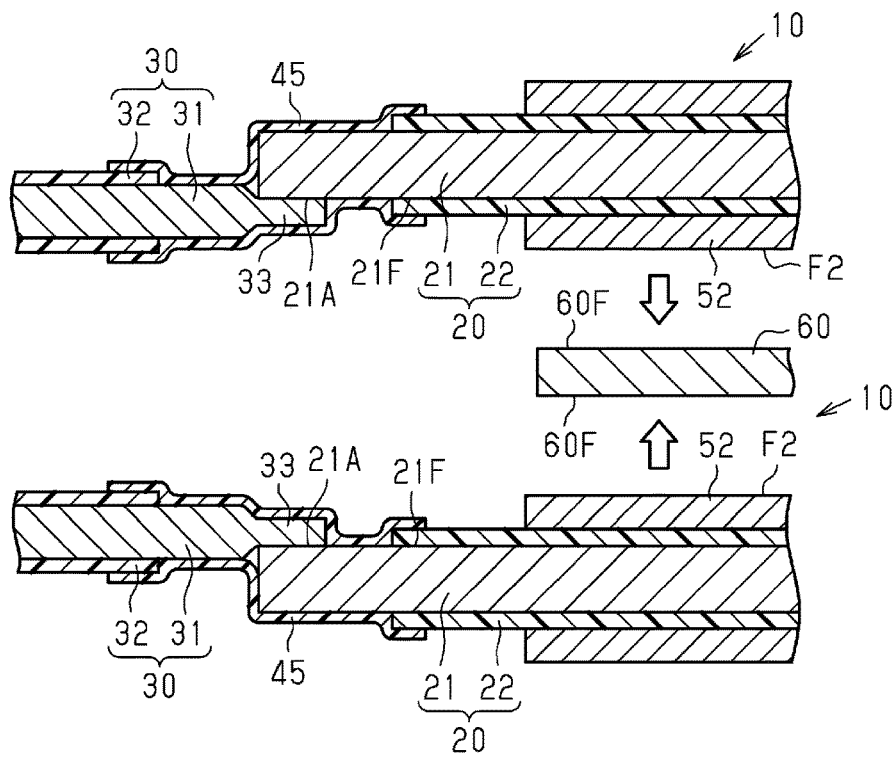

Next, as shown in FIG. 5(c), the two conductive paths 10 that were manufactured separately and the heat dissipation member 60 are gathered together and fixed to each other. At this time, for example, the flat portions F2 of the protective tubes 52 of the conductive paths 10 are brought into surface contact with the flat portions 60F of the heat dissipation member 60. Next, the clamp 72 is attached to the two conductive paths 10 and the heat dissipation member 60, and the grouped state of the two conductive paths 10 and the heat dissipation member 60 is maintained by the clamp 72. In this manner, with the manufacturing method of the present example, after the multiple conductive paths 10 obtained by bonding the core wires 21 and the core wires 31 are manufactured separately, the multiple conductive paths 10 can be gathered together and fixed to each other.

Thereafter, the protective tube 53 that collectively encloses the conductive paths 10 exposed from the protective tubes 52, that is, the end portions of the multiple wires 20, the multiple connection portions 40, and the multiple wires 30, is attached to the outer sides of the multiple protective tubes 52 and the heat dissipation member 60.

Next, operations and effects of the present embodiment will be described.

(1) The multiple protective tubes 52 are formed independently of each other, and one wire 20 is inserted through each protective tube 52. Accordingly, the gap (air layer) between the wires 20 and the protective tubes 52 can be set to be smaller compared to the case where multiple wires 20 are collectively enclosed in one protective tube. Since the air layer between the outer peripheral surface of the wire 20 and the inner peripheral surface of the protective tube 52, that is, the volume and/or thickness of a thermal insulation layer, can be reduced, thermal resistance between the outer peripheral surface of the wire 20 and the inner peripheral surface of the protective tube 52 can be lowered. For this reason, a case can be suppressed in which heat generated by the wires 20 is trapped inside of the protective tube 52, and heat generated by the wires 20 can be efficiently emitted into the air from the outer peripheral surfaces of the protective tubes 52. Accordingly, the heat generated by the wires 20 can be efficiently dissipated, and the heat dissipation ability of the wire harness 1 can be improved. As a result, it is possible to suppress a rise in the temperature of the conductive paths 10.

(2) The inner spaces 52X of the protective tubes 52 were each formed into a shape conforming to the outlines of the wires 20. Accordingly, the gap (air layer) between the outer peripheral surface of the wire 20 and the protective tube 52 can be set to be smaller. Accordingly, the heat dissipation ability of the wire harness 1 can be further improved.

(3) A heat dissipation member 60 that is in contact with the outer peripheral surfaces of the protective tubes 52 and is interposed between the protective tubes 52 that are adjacent to each other was provided. At this time, the heat generated by the wires 20 is transmitted from the outer peripheries of the wires 20 to the protective tubes 52, is transmitted from the outer peripheries of the protective tubes 52 to the heat dissipation member 60, and is emitted into the air from the outer peripheries of the heat dissipation member 60 and the protective tubes 52. Here, since the heat dissipation member 60 has a higher thermal conductivity than the air, the heat generated by the wires 20 can be more efficiently dissipated compared to the case where an air layer is interposed between the adjacent protective tubes 52. Accordingly, the heat dissipation ability of the wire harness 1 can be improved.

(4) Also, due to the heat dissipation member 60 being constituted by a material with a higher thermal conductivity than the protective tubes 52, the heat generated by the wires 20 can be efficiently dissipated through the heat dissipation member 60, even if the thermal conductivity of the protective tubes 52 is low.

(5) The outer peripheral surface (specifically, the flat portion F2) of the protective tube 52 was brought into surface contact with the heat dissipation member 60. Accordingly, the efficiency of transmitting heat from the protective tube 52 to the heat dissipation member 60 can be improved. Consequentially, the heat dissipation ability of the wire harness 1 can be improved.

(6) The cross-sectional shapes of the outer peripheries of the wires 20 and the protective tubes 52 were formed into non-circular shapes, and the cross-sectional shape was circular overall when the multiple protective tubes 52 and the heat dissipation member 60 were all gathered together. In other words, the protective tubes 52 and the heat dissipation members 60 were formed so as to have cross-sectional shapes obtained by dividing a circle. With this configuration, the gaps between the protective tubes 52 and the heat dissipation member 60 can be made smaller and the wire harness 1 (high-rigidity portion 2) can be made more compact, in comparison with the case where the cross-sectional shapes of the outer peripheries of the wires and the protective tubes are formed into circular shapes.

(7) Incidentally, when the wires 20 and the wires 30 are bonded to each other after the multiple wires 20 are inserted through one protective tube, if the bonded portions are arranged side by side in the axial direction, it is difficult to ensure work space (a tool clearance, etc.) for bonding the wires 20 and the wires 30. For this reason, in the conventional technique, the positions of the bonded portions between the wires 20 and the wires 30 are arranged shifted in the axial direction. However, in this case, there is a problem in that unneeded sections appear in the axial directions of the wires 20 and 30.

In contrast to this, in the present embodiment, one of the multiple wires 20 was inserted through each protective tube 52, and the end portion of another wire 30 was electrically connected to the end portion of a wire exposed from the protective tube 52. By employing this structure, even if the wires 20 are inserted through the protective tubes 52 and thereafter the end portions of the wires 30 are bonded to the end portions of the wires 20, the bonding can be performed individually in the respective conductive paths 10. For this reason, if multiple conductive paths 10 obtained by bonding the end portions of the wires 30 to the end portions of the wires 20 inserted through the protective tubes 52 are manufactured, the multiple conductive paths 10 can be manufactured independently of each other. Accordingly, the core wires 21 and the core wires 31 and the core wires 31 can be bonded to each other without being influenced by other conductive paths 10, and therefore workability during manufacture can be improved.

Furthermore, since the multiple conductive paths 10 were manufactured by independently performing the bonding of the wires 20 and the wires 30 and the multiple manufactured conductive paths 10 were gathered together, there is no need to ensure a work space such as a tool clearance between the adjacent connection portions 40. Accordingly, in the multiple conductive paths 10, the positions of the multiple connection portions 40 can be arranged side by side in the axial direction even if the adjacent connection portions 40 are arranged at positions near each other. As a result, it is possible to achieve a reduction in the size of the wire harness 1 at the connection portions 40.

(8) The protective tubes 52 were constituted by shield pipes that electromagnetically shield the wires 20 inserted therein. Accordingly, the protective tubes 52 can be provided with the function of a protective tube for protecting the wires 20, and a function of an electromagnetic shield portion for electromagnetically shielding the wires 20.

Other Embodiments

The above-described embodiment can be implemented with the following modifications. The above-described embodiment and the following modified examples can be implemented in combination with each other as long as there is no technical discrepancy.

In the above-described embodiment, the end portions of the core wires 31 were bonded to the flat portions 21F of the core wires 21, but the positions at which the core wires 21 and the core wires 31 are bonded are not limited thereto.

Figure 6:
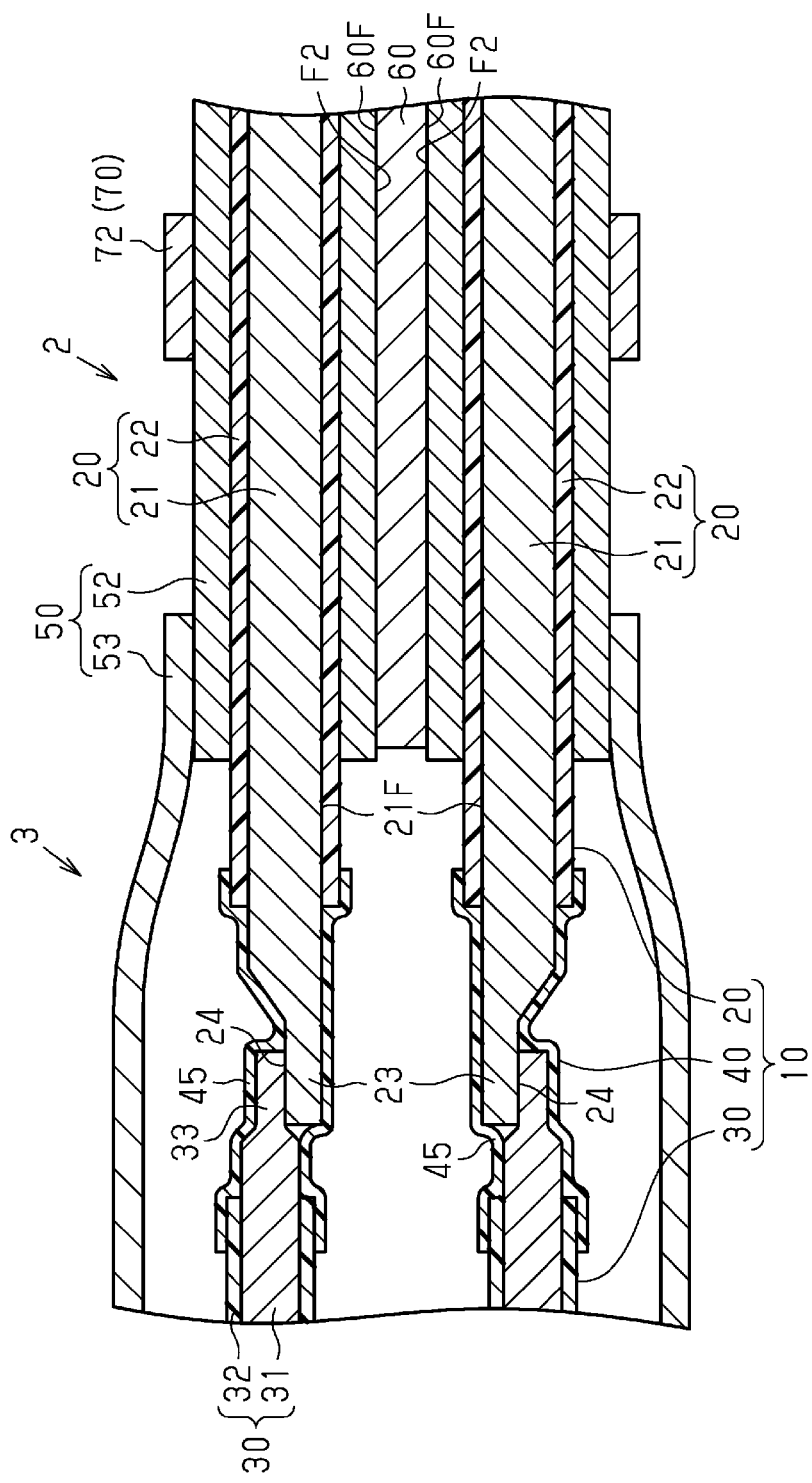
FIG. 6 is a schematic cross-sectional view of a wire harness according to a modified example.

For example, as shown in FIG. 6, crushed portions 23 crushed into flat shapes may also be formed on the end portions of the core wires 21 exposed from the insulative coverings 22. The crushed portions 23 have flat surfaces 24 that are formed to be flat. The end portions of the core wires 31 may also be bonded overlapping with the flat surfaces 24 of the core wires 21. Note that the crushed portions 23 may also be formed toward one side in the radial direction of the core wires 21, and the centers in the thickness direction of the crushed portions 23 may also be formed so as to approximately match the central axes of the core wires 21.

Figure 7:
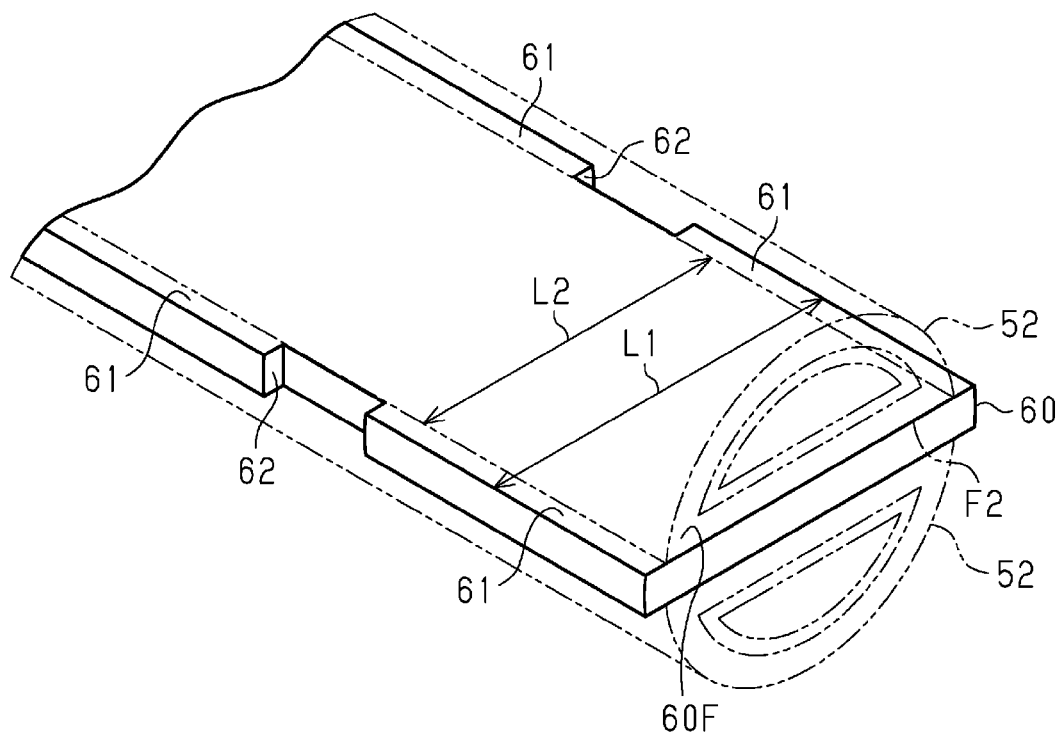
FIG. 7 is a schematic perspective view of a heat dissipation member according to a modified example.

As shown in FIG. 7, fin structures 61 that protrude outward with respect to the outer peripheral surfaces of the protective tubes 52 may also be formed on the heat dissipation member 60. Due to these fin structures 61 being included, the flat portions 60F of the heat dissipation member 60 are formed with larger surface areas than the flat portions F2 of the protective tubes 52. Since the surface area of the heat dissipation member 60 can be increased in this manner, the heat dissipation ability of the wire harness 1 can be improved. Note that a length L1 in the width direction of the flat portion 60F of the portion including the fin structure 61 is set to be longer than a length L2 of the flat portion F2 forming the diameter of the protective tube 52 with a semicircular cross-sectional shape.

The fin structures 61 are formed so as to extend in the extension direction of the heat dissipation member 60. However, the fin structures 61 are not formed at the position at which the clamp 72 (see FIG. 2) is attached. For this reason, notch portions 62 are formed in the heat dissipation member 60 at the position at which the clamp 72 is attached. Then, the clamp 72 is attached so as to fit into the notch portions 62. Due to the notch portions 62 being provided, even if the fin structures 61 are provided, the clamp 72 can be attached to the multiple protective tubes 52 and the heat dissipation member 60 without interfering with the fin structures 61. Also, since the notch portions 62 can be used for positioning when attaching the clamp 72, the positioning of the clamp 72 can be performed easily.

In the above-described embodiment, the electromagnetic shield portion in the high-rigidity portion 2 was constituted by only the protective tubes 52, but the configuration of the electromagnetic shield portion in the high-rigidity portion 2 is not particularly limited.

Figure 8:
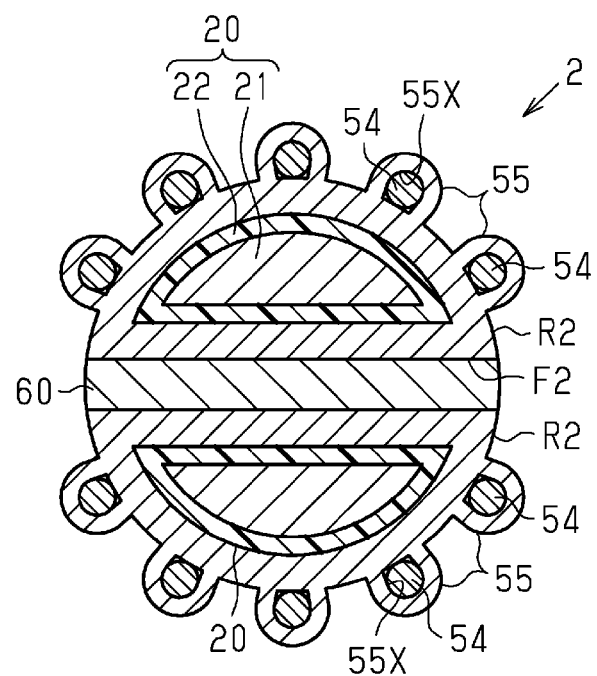
FIG. 8 is a schematic cross-sectional view of a wire harness according to a modified example.

For example, as shown in FIG. 8, drain wires 54 may also be passed through the interiors of the protective tubes 52. Multiple (here, five) protrusion portions 55 that protrude outward with respect to the curved portion R2 and that extend in the extension direction of the protective tube 52 are formed on the outer peripheral surface (here, the curved portion R2) of the protective tube 52. The protrusion portions 55 are formed on the outer peripheral surfaces (here, the curved portions R2) of the protective tubes 52 located on the outer side (the outer side of the high-rigidity portion 2) when the multiple protective tubes 52 are gathered together. The multiple protrusion portions 55 are provided at a predetermined interval in the peripheral direction of the curved portions R2. Insertion portions 55X (insertions) that extend in the extension direction of the protective tubes 52 are formed inside of the protrusion portions 55. Then, the drain wires 54 are inserted into the insertion portions 55X. The drain wires 54 may also be naked wires composed of only conductive core wires, and may also be insulated wires having conductive core wires and insulative coverings covering the outer peripheries of the core wires.

At this time, if the protective tubes 52 are composed of metal or a conductive resin, the electromagnetic shield portion is constituted by the protective tubes 52 and the drain wires 54. Accordingly, the wires 20 can be electromagnetically shielded using both the electromagnetic shield function of the protective tubes 52 and the electromagnetic shield function of the drain wires 54. Note that the number of the drain wires 54 is set according to the electromagnetic shield performed required in the wire harness 1. The numbers of the protrusion portions 55 and the drain wires 54 may be one to four, or six or more.

With the protective tubes 52 shown in FIG. 8, due to the protrusion portions 55 being provided, the surface areas of the protective tubes 52 that function also as heat dissipation members can be increased, and therefore the heat dissipation ability of the wire harness 1 can be improved.

Alternatively, an electromagnetic shield portion that collectively covers the multiple protective tubes 52 may also be provided. For example, a braided wire, a metal foil, or the like can be used as this electromagnetic shield portion.

In the above-described embodiment, the cross-sectional shapes of the outer peripheries of the wires 20 and the protective tubes 52 were formed into semi-circular shapes, but the cross-sectional shapes are not particularly limited.

Figure 9:
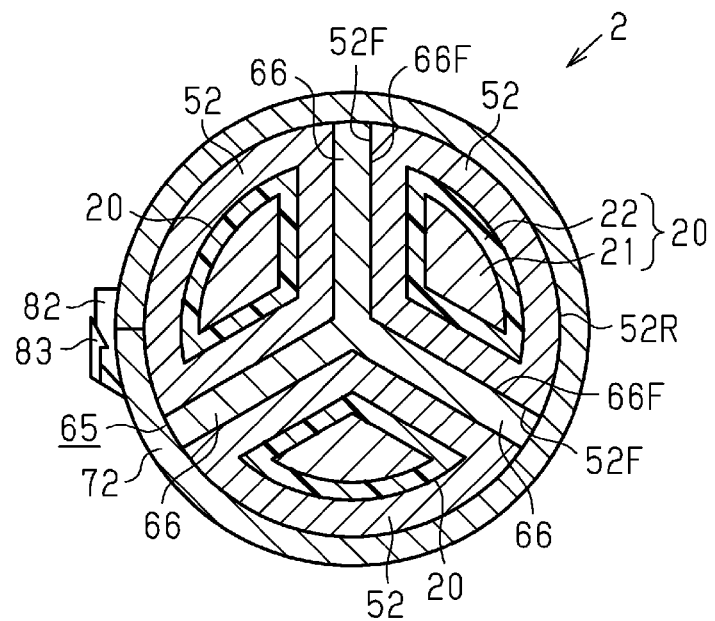
FIG. 9 is a schematic cross-sectional view of a wire harness according to a modified example.

For example, as shown in FIG. 9, the cross-sectional shapes of the outer peripheries of the wires 20 and the protective tubes 52 may also be formed into fan shapes. The high-rigidity portion 2 in this case is formed such that, for example, the cross-sectional shape is approximately circular overall when the three protective tubes 52 and the heat dissipation member 65 are all gathered together. Also, the state in which the three protective tubes 52 and the heat dissipation member 65 are all gathered together is maintained by the clamps 72. The cross-sectional shape of the outer periphery of the protective tube 52 shown in FIG. 9 is set to be a fan shape with a vertex angle or a central angle of 120 degrees. The outer peripheral surfaces of the protective tubes 52 are each constituted by two flat portions 52F and one curved portion 52R. The cross-sectional shapes of the outer peripheries of the wires 20 (core wires 21 and insulative coverings 22) shown in FIG. 9 are formed into fan shapes with a vertex angle or a central angle of 120 degrees, similarly to the protective tubes 52. The central angle of the fan shape of the cross-section of the wires 20 can be expressed as 360 degrees÷N, where N is the number of bundled wires 20, and N is an integer that is 2 or more. In the example shown in FIG. 3, N is 2, and in the example shown in FIG. 9, N is 3. The same applies to the protective tubes 52 as well. Also, the heat dissipation member 65 is set to be a shape obtained by joining three wall portions 66 in a radial shape at an interval of 120 degrees. The wall portions 66 are formed so as to be in contact with the outer peripheral surfaces of the protective tubes 52 and to be interposed between the adjacent protective tubes 52. The wall portions 66 are formed into flat shapes, for example. The wall portions 66 have two flat portions 66F.

In the example shown in FIG. 9, the protective tubes 52 are arranged between the adjacent wall portions 66. One of the flat portions 52F of each protective tube 52 is brought into surface contact with the flat portion 66F of one of the wall portions 66 that are adjacent to each other, and the other flat portion 52F is brought into surface contact with the flat portion 66F of the other wall portion 66.

Alternatively, the cross-sectional shapes of the outer peripheries of the wires 20 and the protective tubes 52 may also be formed into, for example, rectangular shapes or circular shapes. In this case, the cross-sectional shape of the outer periphery of the heat dissipation member can also be modified as appropriate.

In the above-described embodiment, the outer peripheral surfaces of the protective tubes 52 were brought into surface contact with the outer peripheral surface of the heat dissipation member 60, but for example, the outer peripheral surfaces of the protective tubes 52 may also be brought into linear contact or point contact with the outer circumferential surface of the heat dissipation member 60. Alternatively, the flat portions F2 of the protective tubes 52 may also be adhered to the flat portion 60F of the heat dissipation member 60.

In the above-described embodiment, the cross-sectional shape of the outer periphery of the high-rigidity portion 2 in the state in which the multiple protective tubes 52 and the heat dissipation members 60 are gathered together was approximately circular overall, but there is no limitation to this. For example, the cross-sectional shape of the outer periphery of the high-rigidity portion 2 in the state in which the multiple protective tubes 52 and the heat dissipation member 60 are gathered together may also be semicircular or rectangular.

Figure 10:
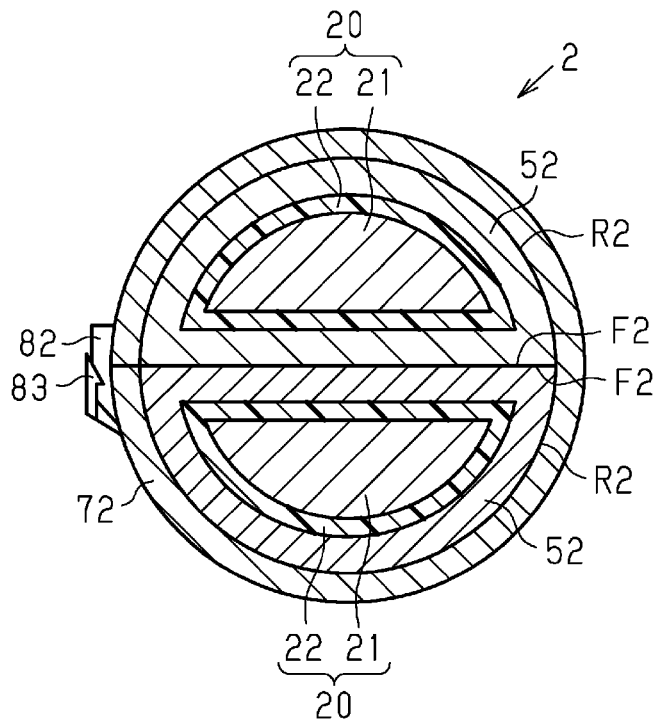
FIG. 10 is a schematic cross-sectional view of a wire harness according to a modified example.

The heat dissipation members 60 and 65 of the above-described embodiment and the above-described modified examples may also be omitted. For example, as shown in FIG. 10, the heat dissipation member 60 of the above-described embodiment may also be omitted, and the flat portions F2 of the protective tubes 52 that are adjacent to each other may be brought into surface contact with each other. The high-rigidity portion 2 in this case is formed such that, for example, the cross-sectional shape is approximately circular overall when the two protective tubes 52 are all gathered together. Then, the clamp 72 maintains the state in which the two protective tubes 52 are gathered together.

In the above-described embodiment, the internal space 52X of the protective tube 52 was formed into a shape conforming to the outline of the wire 20, but there is no limitation to this. For example, the internal space 52X of the protective tube 52 may also be formed into a semicircular columnar shape, and the wire 20 may also be formed into a shape (e.g., a circular columnar shape) that is different from that of the internal space 52X.

That length of the heat dissipation member 60 in the above-described embodiment may also be set to be longer than that of the protective tubes 52. However, even if the length of the heat dissipation member 60 is set to be longer than that of the protective tubes 52, the length of the heat dissipation member 60 is preferably set to a length according to which the heat dissipation member 60 does not interfere with the connection portions 40 (specifically, the insulation members 45). Due to being set in this manner, it is possible to suitably maintain the state in which the flat portions F2 of the protective tubes 52 and the flat portions 60F of the heat dissipation member 60 are in surface contact with each other.

In the above-described embodiment, the clamp 72 was realized as a fixing portion for gathering together and fixing the multiple protective tubes 52 and the heat dissipation member 60, but there is no limitation to this. For example, the fixing portion for gathering together and fixing the multiple protective tubes 52 and the heat dissipation member 60 to each other is not limited to a fixing portion that is fixed to a vehicle body of a vehicle or the like, and adhesive tape, a cable tie, or the like can be used thereas.

In the above-described embodiment, the wires 20 and protective tubes 52 constituting the high-rigidity portion 2 had relatively high rigidities (e.g., rigidities according to which a shape conforming to the wiring path of the conductive paths 10 can be maintained). There is no limitation to this, and for example, only one of the wire 20 and the protective tube 52 may also have a relatively high rigidity. For example, the wire 20 may be constituted by a stranded wire, and the protective tube 52 may be constituted by a pipe made of metal. Alternatively, the heat dissipation member 60 constituting the high-rigidity portion 2 may also have a relatively high rigidity.

In the above-described embodiment, the wire 20 was realized as a non-shield wire, but the type of the wire 20 is not limited to this. For example, the wire 20 may also be realized as a shield wire having a shield structure.

In the above-described embodiment, the wire 30 was realized as a non-shield wire, but the type of the wire 30 is not limited to this. For example, the wire 30 may also be realized as a shield wire having a shield structure.

In the above-described embodiment, a configuration was used in which the conductive paths 10 connect multiple different types of wires 20 and wires 30 in the extension direction of the conductive paths 10, but there is no limitation to this. For example, the entire length of the conductive path 10 may also be constituted by only a single type of wire. A stranded wire with excellent flexibility or the like can be used as the single type of wire in this case.

In the above-described embodiment, the multiple protective tubes 52 all had the same size and the same shape, but there is no limitation to this. For example, multiple types of protective tubes 52 with different cross-sectional shapes may also be gathered together.

In the above-described embodiment, the wire harness 1 having the electromagnetic shield function was realized, but a wire harness 1 that does not include the electromagnetic shield function may also be realized.

In the above-described embodiment and the above-described modified examples, there were two or three wires 20 provided in the high-rigidity portion 2, but there is no limitation to this, and the number of wires 20 can be modified according to the specification of the vehicle. For example, there may also be four or more wires 20 provided in the high-rigidity portion 2. For example, it is also possible to use a configuration in which a low-voltage wire for connecting a low-voltage battery and various low-voltage devices (e.g., a lamp, car audio, etc.) to each other is added as a wire provided in the high-rigidity portion 2.

The arrangement relationship between the inverter 5 and the high-voltage battery 6 in the vehicle is not limited to the above-described embodiment and may also be modified according to the vehicle configuration.

In the above-described embodiment, the inverter 5 and the high-voltage battery 6 were employed as the electrical devices connected by conductive paths 10, but there is no limitation to this. For example, the present disclosure may also be used in a wire connecting the inverter 5 and a wheel-driving motor. That is, the present disclosure can be applied so long as it electrically connects electrical devices mounted in a vehicle to each other.

The outer peripheral surface of the protective tube 52 is referred to as the side surface of the protective tube 52 in some cases, the curved portions R2 and 52R of the protective tube 52 are referred to as radially inward surfaces of the protective tube 52 in some cases, and the flat portions F2 and 52F of the protective tube 52 are referred to as radially inward surfaces of the protective tube 52 in some cases.

The present disclosure encompasses the following implementation examples. Reference numerals of the constituent elements of the embodiment are added to assist comprehension and are not intended to limit the disclosure.

Supplementary Note 1

A wire harness (1) according to several implementation examples is configured to connect multiple electrical devices (5, 6) arranged inside of a vehicle, and the wire harness (1) includes: two end portions (3) that are arranged at least partially inside of the vehicle and are respectively connected to the multiple electrical devices (5, 6); and an intermediate portion (2) that is wired under a floor of the vehicle and is different from the two end portions (3). The intermediate portion (2) includes: multiple protective tubes (52) that each include an internal space (52X) and side surfaces (R2, F2; 52R, 52F) including a radially outward surface (R2; 52R) and a radially inward surface (F2; 52F); multiple wires (20) that are inserted into the internal spaces (52X) of the multiple protective tubes (52); a heat dissipation member (60) that is arranged parallel to the multiple protective tubes (52) and is configured to dissipate heat of the multiple wires (20); and a clamp (72) that bundles, into one bundle, the multiple protective tubes (52) into which the multiple wires (20) have been respectively inserted, and the heat dissipation member (60). The heat dissipation member (60) is a single part that is sandwiched between the radially inward surfaces (F2; 52F) of the multiple protective tubes (52) and is in direct contact with the radially inward surfaces (F2; 52F) of the multiple protective tubes (52).

Supplementary Note 2

In several implementation examples, the heat dissipation member (60) includes a central portion that is located in the center of the bundle of the multiple protective tubes (52) and the heat dissipation member (60) in a cross-sectional view of the intermediate portion (2) that is orthogonal to a longitudinal axis of the intermediate portion (2), and at least two outer end portions that are located on an outermost surface in the radial direction of the bundle of the multiple protective tubes (52) and the heat dissipation member (60).

Supplementary Note 3

In several implementation examples, the entire radially inward surface (F2; 52F) of each of the protective tubes (52) comes into direct contact with the heat dissipation member (60) so as to be able to conduct heat, and preferably without a thermally insulating material being interposed therebetween, in a cross-sectional view of the intermediate portion (2) that is orthogonal to the longitudinal axis of the intermediate portion (2).

Supplementary Note 4

In several implementation examples, the radially outward surface (R2; 52R) of each of the protective tubes (52) is exposed to a fluid on the outside of the wire harness (1), which may be air.

Supplementary Note 5

In several implementation examples, the radially outward surface (R2; 52R) of each of the protective tubes (52) includes a first longitudinal direction portion that is supported by the clamp (72) and a second longitudinal direction portion that is not supported by the clamp (72).

Supplementary Note 6

In several implementation examples, the multiple protective tubes (52) are each a metal pipe or a hard resin pipe.

Supplementary Note 7

In several implementation examples, the bundle of the multiple protective tubes (52) and the heat dissipation member (60) includes a first cross-sectional shape in a cross-sectional view of the intermediate portion (2) that is orthogonal to the longitudinal axis of the intermediate portion (2), the multiple wires (20) include second cross-sectional shapes that are the same as each other in the cross-sectional view of the intermediate portion (2), the multiple protective tubes (52) include third cross-sectional shapes that are the same as each other in the cross-sectional view of the intermediate portion (2), and the heat dissipation member (60) includes a fourth cross-sectional shape that is different from the first cross-sectional shape, the second cross-sectional shape, and the third cross-sectional shape in the cross-sectional view of the intermediate portion (2).

Supplementary Note 8

In several implementation examples, the first cross-sectional shape differs from both the second cross-sectional shape and the third cross-sectional shape.

Supplementary Note 9

In several implementation examples, the first cross-sectional shape is circular, and the second cross-sectional shape and the third cross-sectional shape are fan-shaped.

Supplementary Note 10

In several implementation examples, the multiple protective tubes (52) are two protective tubes (52), the first cross-sectional shape is circular, the second cross-sectional shape and the third cross-sectional shape are semi-circular, and the fourth cross-sectional shape is I-shaped.

Supplementary Note 11

In several implementation examples, the multiple protective tubes (52) are three protective tubes (52), the first cross-sectional shape is circular, the second cross-sectional shape and the third cross-sectional shape are fan-shaped, and the fourth cross-sectional shape is Y-shaped, cross-shaped, or asterisk-shaped.

It should be obvious to a person skilled in the art that the present disclosure may also be realized in other unique modes without departing from the technical idea. For example, some of the parts described in the embodiment (or one or more aspects thereof) may also be omitted, and several parts may also be combined.

The invention claimed is:

1. A wire harness comprising:
a plurality of wires each including a core wire and an insulative covering that covers an outer periphery of the core wire;
a plurality of protective tubes into which the plurality of wires are respectively inserted, and which are each formed independently;
a fixing member that gathers together and fixes the plurality of protective tubes; and
a plate that is in contact with an outer peripheral surface of each of the protective tubes and is provided interposed between the protective tubes that are adjacent to each other, wherein
a cross-sectional shape of an outer periphery of each of the wires is formed into a non-circular shape,
a cross-sectional shape of an outer periphery of each of the protective tubes is formed into a non-circular shape, and
cross-sectional shapes of outer peripheries of the plurality of protective tubes and the plate are formed such that when the plurality of protective tubes and the plate are all gathered together, the cross-sectional shape of the outer periphery thereof is a circular shape overall.

2. The wire harness according to claim 1, wherein an internal space of each of the protective tubes is formed into a shape conforming to an outline of a respective wire.

3. The wire harness according to claim 1, wherein the outer peripheral surface of each of the protective tubes is in surface contact with the plate.

4. A wire harness comprising:
a plurality of wires each including a core wire and an insulative covering that covers an outer periphery of the core wire;
a plurality of protective tubes into which the plurality of wires are respectively inserted, and which are each formed independently;
a fixing member that gathers together and fixes the plurality of protective tubes; and
a plate that is in contact with an outer peripheral surface of each of the protective tubes and is provided interposed between the protective tubes that are adjacent to each other, wherein
the protective tubes each include a flat portion and a curved portion,
the plate includes flat portions with which the flat portions of the protective tubes are in surface contact, and
the flat portions of the plate are formed so as to protrude outward with respect to the flat portions of the protective tubes and are each formed with a surface area that is greater than that of each of the flat portions of the protective tubes.

5. The wire harness according to claim 1, wherein
the protective tubes are provided such that ends of the wires are exposed,
ends of other wires with better flexibility than the wires are respectively electrically connected to the ends of the wires exposed from the protective tubes, and
a plurality of the other wires are collectively enclosed by a protective tube other than the protective tubes.

6. The wire harness according to claim 5, wherein
an outer peripheral surface of each core wire includes a flat portion and a curved portion, and
the other wires are each connected to the flat portion of a respective core wire.

7. The wire harness according to claim 1, wherein the protective tubes are shield pipes for electromagnetically shielding the wires inserted therein.

8. The wire harness according to claim 1, wherein
an insertion that protrudes outward and extends in an extension direction of the protective tubes is provided on the outer peripheral surface of each of the protective tubes, and
a drain wire is inserted into the insertion.

9. The wire harness according to claim 4, wherein
an internal space of each of the protective tubes is formed into a shape conforming to an outline of a respective wire.

10. The wire harness according to claim 4, wherein
the outer peripheral surface of each of the protective tubes is in surface contact with the plate.

11. The wire harness according to claim 4, wherein
the protective tubes are provided such that ends of the wires are exposed,
ends of other wires with better flexibility than the wires are respectively electrically connected to the ends of the wires exposed from the protective tubes, and
a plurality of the other wires are collectively enclosed by a protective tube other than the protective tubes.

12. The wire harness according to claim 11, wherein
an outer peripheral surface of each core wire includes a flat portion and a curved portion, and
the other wires are each connected to the flat portion of a respective core wire.

13. The wire harness according to claim 4, wherein the protective tubes are shield pipes for electromagnetically shielding the wires inserted therein.

14. The wire harness according to claim 4, wherein
an insertion that protrudes outward and extends in an extension direction of the protective tubes is provided on the outer peripheral surface of each of the protective tubes, and
a drain wire is inserted into the insertion.

* * * * *